United States Patent [19]

Mundy et al.

[11] Patent Number: 4,862,229
[45] Date of Patent: Aug. 29, 1989

[54] SEMICONDUCTOR SCHOTTKY DEVICES HAVING IMPROVED VOLTAGE BLOCKING CHARACTERISTICS

[75] Inventors: Stephen J. Mundy, Manchester; John M. Shannon, Whyteleafe, both of England

[73] Assignee: U.S. Philips Corp., New York, N.Y.

[21] Appl. No.: 309,017

[22] Filed: Feb. 6, 1989

Related U.S. Application Data

[63] Continuation of Ser. No. 90,421, Aug. 26, 1987, abandoned, which is a continuation of Ser. No. 860,274, May 6, 1986, abandoned.

[30] Foreign Application Priority Data

Jun. 10, 1985 [GB] United Kingdom ............... 8514628

[51] Int. Cl.$^4$ ............................................. H01L 29/48
[52] U.S. Cl. ........................................ 357/15; 357/52; 357/53; 357/55; 357/86
[58] Field of Search ................ 357/15, 52, 53, 55, 357/86

[56] References Cited

U.S. PATENT DOCUMENTS 4,463,366 7/1984 Ishii et al. ............................ 357/15
4,538,244 8/1985 Sugo et al. ........................... 357/15
4,646,115 2/1987 Shannon et al. ..................... 357/55
4,670,764 6/1987 Benjamin et al. .................... 357/55

OTHER PUBLICATIONS

Zettler et al.–IEEE Transactions on Electron Devices, vol. ED-16, No. 1–Jan. 1969–pp. 58–62.

Primary Examiner—Edward J. Wojciechowicz
Attorney, Agent, or Firm—Steven R. Biren

[57] ABSTRACT

In a semiconductor device (e.g. a fast switching Schottky diode) a metal-based layer forms separate areas of an active Schottky barrier between closely-spaced field-relief regions which provide the device with an improved voltage blocking characteristic. In order to restrict the flow of minority carriers into the adjacent body portion under forward bias, the dopant concentration of the field-relief regions at the surface where contacted by the metal-based layer is sufficiently low as to form a further Schottky barrier with the metal-based layer. This further barrier which is in series with the minority-carrier injecting p-n junctions of the field-relief regions is reverse-biased when the active barrier and p-n junction are forward biased so that the minority carrier injection is restricted by the leakage current across the further barrier.

6 Claims, 2 Drawing Sheets

SEMICONDUCTOR SCHOTTKY DEVICES HAVING IMPROVED VOLTAGE BLOCKING CHARACTERISTICS

This is a continuation of application Ser. No. 090,421, filed Aug. 26, 1987, which was a continuation of Ser. No. 860,274, filed May 6, 1986, both now abandoned.

BACKGROUND OF THE INVENTION

This invention relates to semiconductor devices including a Schottky barrier and having an improved voltage blocking characteristic, particularly but not exclusively Schottky diodes designed for fast switching and blocking of medium or high voltages.

Schottky diodes with high breakdown voltages are described in the article of that title by B. M. Wilamowski in Solid State Electronics, Vol 26, (1983), No. 5, pages 491 to 493. The disclosed device comprises a semiconductor body a portion of which is of one conductivity type, a metal-based layer at a surface of the body and forming an active barrier with said body portion at a plurality of separate areas, and closely-spaced field-relief regions of opposite conductivity type which form with the body portion a p-n junction protruding to a depth in the body below the active Schottky barrier. The separate areas of the active Schottky barrier are located between the closely-spaced field-relief regions. The device has an improved voltage blocking characteristic due to the field-relief regions being contacted at said surface by the metal-based layer and being sufficiently closely spaced that depletion layers extending in the body portion from neighboring field-relief regions merge together under reverse bias of the active Schottky barrier.

In the Schottky diodes made by B. M. Wilamowski, the field-relief regions are in the form of a grid of highly-doped regions of the opposite conductivity type which were diffused from the surface to have a sheet resistance of approximately 100 ohms per square. This sheet resistance is equivalent to a doping concentration of at least $5 \times 10^{18} cm^{-3}$ at the body surface. The metal-based layer, which was of aluminum in the particular diodes made by Wilamowski, forms an ohmic contact with these highly-doped field-relief regions.

These field-relief regions act as a screen to lower the electrical field near the Schottky barrier at the surface during reverse bias of the Schottky barrier. As a result, the blocking capability is improved by a reduction of the reverse leakage current, a sharpening of the breakdown characteristic and an increase of the breakdown voltage, e.g. from 43 volts to 135 volts. When the Schottky barrier is forward biased the field-relief regions are considered by Wilamowski to be inactive since the forward voltage drop on the Schottky barrier is smaller than the forward voltage drop would be on the p-n junction for the same current density.

It is necessary to enlarge the device area in order to accommodate both the field-relief regions and a given area for the Schottky barrier. This increases the junction parasitic capacitance, and so can reduce the switching speed of the device particularly at low voltages. However, experiments conducted by the present applicants on such Schottky diodes having highly-doped field-relief regions indicate that a significant reduction in the switching speed of this device can also result from minority carrier storage effects as a result of minority carriers injected into the body portion at the p-n junction when the device is forward biased.

SUMMARY OF THE INVENTION

The present invention is based on the recognition that when operating at even moderate current densities or with Schottky barriers having a high barrier this p-n junction acts as an efficient injector of minority carriers which will seriously degrade the frequency response of the overall structure.

According to the present invention, there is provided a semiconductor device comprising a semiconductor body a portion of which is of one conductivity type, a metal-based layer at a surface of the body and forming an active Schottky barrier with said body portion at a plurality of separate areas, and closely-spaced field-relief regions of opposite conductivity type which form with the body portion a p-n junction protruding to a depth in the body below the active Schottky barrier, the separate areas of the active Schottky barrier being located between the closely-spaced field-relief regions, the field-relief regions being contacted at said surface by the metal-based layer and being sufficiently closely spaced that depletion layers extending in the body portion from neighboring field-relief regions merge together under reverse-bias of the active Schottky barrier to provide the device with an improved voltage blocking characterized characterised in that the conductivity-type determining dopant concentration of the field-relief regions at the surface where contacted by the metal-based layer is sufficiently low as to form with the metal-based layer a further Schottky barrier which is in series with the p-n junction between the field-relief regions and the body portion, thus restricting the flow of minority carriers into the body portion under forward-bias of the active Schottky barrier.

Because the further Schottky barrier is formed on an opposite conductivity type region to that of the active Schottky barrier, said further Schottky barrier is reverse-biased by the applied voltage which forward biases the active Schottky barrier. Therefore, when the active barrier is forward biased, the minority carrier injection into the body portion from the field-relief regions is restricted by the leakage current across this rectifying reverse-biased further barrier in series with the p-n junction, as well as being restricted by the resistance of the field-relief regions due to the low conductivity-type determining dopant concentration.

It should be noted that co-pending European patent application No. 84201865.7 which was published as EP-A No. 147 893 after the priority date of the present application, also disclosed providing field-relief regions of Schottky and other unipolar barrier devices with means for restricting the flow of minority carriers into the body portion under forward bias of the active barrier. These means disclosed in EP-A No. 0 147 893 involve providing at the area of the field-relief regions a layer of different material from that of the body portion and from that of the unipolar barrier-forming means. Extra lithographic and processing steps may be needed to provide some of these means disclosed in EP-A No. 0 147 893.

In accordance with the present invention the restriction of minority carrier injection by means of the formation of the further Schottky barrier can be achieved by simply using a low doping concentration to form the field-relief regions; thus, for example, implantation using a low dose of dopant ions may be used to provide the field-relief regions in the body in a precisely controllable manner as regards their conductivity type determining dopant concentration.

However, if desired, additional processing steps may be used to optimize the Schottky barrier formed with the field-relief regions of a device in accordance with the invention. Thus, for example, a recess may be etched at the body surface at least where the further regions are to be contacted by the metal-based layer; etching such a recess can remove a higher dopant concentration which may be present at the body surface so that the further Schottky barrier is formed with a deeper part of the further region having a lower dopant concentration. It is also possible to provide, at the surface of the field-relief regions (for example by ion implantation) a higher dopant concentration of said one conductivity type as a layer which is thinner than the thickenss of the internally-generated depletion layer formed at said further Schottky barrier with zero bias and which is depleted thereby, the presence of said depleted dopant layer serving to increase the height of said further Schottky barrier.

BRIEF DESCRIPTION OF THE DRAWING

Particular examples of these and other features in accordance with the present invention will now be described with reference to the accompanying diagrammatic drawing, which illustrates, by way of example, several different embodiments of the invention. In the drawings.

Figure 1:
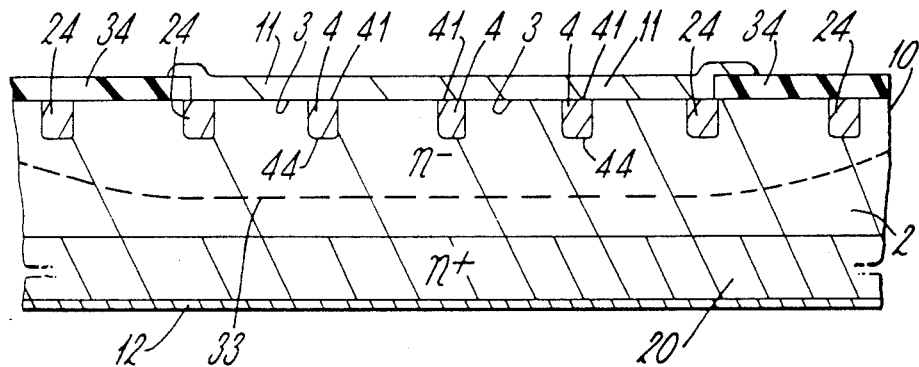
FIG. 1 is a cross-sectional view of part of one semiconductor device in accordance with the invention.

It should be noted that all the Figures are diagrammatic and not drawn to scale. The relative dimensions and proportions of various parts of these Figures that have been shown exaggerated or reduced for the sake of clarity and convenience in the drawing. The same reference signs as used in one Figure are also generally used to refer to corresponding or similar parts in the other embodiments.

DESCRIPTION OF THE PREFERRED EMBODIMENTS

The semiconductor device of FIG. 1 is a high voltage Schottky diode comprising a semiconductor body 10, for example of monocrystalline silicon, a portion 2 of which is of one conductivity type (n type in the example shown). A metal-based layer 11 is present at the upper major surface of the body 10 and forms a Schottky barrier with the body portion 2 at a plurality of separate areas to constitute the active barrier 3 of the diode. The layer 11 may be of a metal, an alloy or for example a metal silicide. Closely spaced field-relief regions 4 of opposite conductivity type (p type in the example shown) form with the body portion 2 a p-n junction 44 which protrudes to a depth in the body 10 below the active barrier 3, and the separate areas of the active barrier 3 are located between the closely-spaced field-relief regions 4. In a particular embodiment of the diode of FIG. 1, the regions 4 may be in a concentric arrangement with, for example, a central region 4 and an annular surrounding region 4. The field-relief regions 4 are sufficiently closely spaced that depletion layers 33 extending in the body from neighboring regions 4 merge together under reverse-bias of the active barrier 3 to provide the device with a high voltage blocking characteristic.

In accordance with the present invention the p type dopant concentration of the field-relief regions 4 at the upper surface where contacted by the metal-based layer 11 is sufficiently low so as to form a further Schottky barrier 41 with the metal-based layer 11. This further rectifying barrier 41 is in series with the p-n junction 44 and provides the field-relief regions 4 with means restricting the flow of minority carriers (holes in this example) into the n type body portion 2 under forward bias of the active Schottky barrier 3. Thus, when a positive voltage is applied to the metal-based layer 11 with respect to the n type body portion the Schottky barrier 41 on the p type regions 4 is reverse-biased while p-n junction 44 and the active Schottky barrier 3 on the n type body portion 2 are both forward-biased. The hole injection from the regions 4 into the body portion 2 is thus restricted by the current flow from the layer 11 which is restricted to the magnitude of the leakage current across the reverse-biased barrier 41. The resistance of the regions 4 due to their low dopant concentration additionally assists in restricting the current flow through the regions 4.

The metal-based layer 11 contacts the regions 4 and body portion 2 at a window in an insulating layer 34 at the body surface. As illustrated in FIG. 1, guard rings 24 may also be provided in the body portion 2 around the contact window. FIG. 1 illustrates two such concentric guard rings provided in known manner as p type annular regions in the n type portion 2. These p type regions 24 may be formed using the same processing steps as used to provide the field-relief regions 4.

It should be noted that the diode of FIG. 1 is quite different from those disclosed in the Solid State Electronics article by B. M. Wilamowski. In the Wilamowski diodes the doping concentration of the field-relief regions is so high that the difference between the electron work function of the metal layer and the electron affinity of the semiconductor region is overcome by quantum tunnelling of charge carriers to give an effectively ohmic contact at the surface of the field-relief regions. Consequently the metal layer in the Wilamowski diodes does not form a rectifying Schottky barrier with the field-relief regions.

The diode of FIG. 1 can be manufactured using known device technologies. Thus, for example, the body portion 2 may be formed by a high resistivity n type epitaxial layer on a high conductivity n type silicon substrate 20 which forms part of the connection to the body portion 2. A masking layer 40 is provided on the surface of the epitaxial layer 2 and has windows at the areas where the p type regions 4 and 24 are to be formed. This masking layer 40 may comprise thermally grown silicon dioxide, and part of the layer 40 may be retained in the finished device as part of the insulating layer 34. The dopant concentration for the regions 4 and 24 may be introduced into the epitaxial layer 2 by implantation of boron ions via the windows in the masking layer 40. The wide beam of boron ions is indicated by arrows 42 in FIG. 2. Either during and/or after the implantation, the body 10 is heated to diffuse the boron to the desired depth in the body. The insulating layer 34 is then provided with its contact window, and a suitable metal for forming the active Schottky barrier 3 is then deposited over the contact window. This latter metal layer 11 also contacts and forms the further Schottky barrier 41 with the field-relief regions 4. An electrode layer 12 of, for example, aluminum is deposited on the back surface of the substrate 20.

In order to obtain the low dopant concentration of the regions 4 which is required to form the further rectifying Schottky barrier 41, a low dose of boron ions 42 is used for the implantation. Normally for this purpose a boron ion dose of less than $10^{13} cm^{-2}$ is used, for example about $5 \times 10^{12} cm^{-2}$ or even less, depending on the extent to which the boron dose is subsequently diffused in the body and on the particular metal chosen for the layer 11. Normally the implantation and diffusion conditions should be chosen such that the final boron concentration at the surface where contacted by the metal layer 11 is less than $5 \times 10^{16} cm^{-3}$. A low boron concentration, for example less than $5 \times 10^{15} cm^{-3}$ is desirable particularly when the metal layer 11 is such as to normally form a low barrier with p type material. Normally the composition of the barrier-forming metal-based layer 11 is chosen to provide a required barrier height for the active barrier 3 of the device. In order to restrict minority carrier injection at the forward-biased p-n junction 44, the height of the further Schottky barrier 41 formed with the field-relief regions 4 should normally be as high as possible and preferably at least half that of the active barrier 3 formed with the body portion 2.

In choosing an appropriate barrier height for a particular Schottky diode, there are several major considerations to bear in mind: the forward voltage drop increases as the barrier height increases; the (reverse) leakage current decreases exponentially with increasing barrier height; and the speed may decrease with high barrier heights at high barrier operating temperatures due to minority carrier injection from the forward-biased Schottky barrier itself.

The barrier height of the active barrier 3 is usually chosen to minimize the overall power dissipation, although a comprise is usually necessary since one particular aspect of the device performance (e.g. operating temperature, speed, forward current handling capability, or some combination of such requirements) may place a limit on the barrier height. Unless other steps are taken to modify the situation, a metal-based layer 11 which forms a high Schottky barrier with n type semiconductor material will form a low Schottky barrier with the same semiconductor material of p type.

A low barrier height would normally be chosen for the active barrier 3 in low voltage evices (e.g. a Schottky diode with a 10 volt blocking capability), and the high leakage current in these devices can be reduced by providing the field-relief means 41-4-44 in accordance with the present invention. In this case, the height of the barrier 41 to the opposite conductivity type field-relief regions 4 would be large, and hence the injection from the regions 4 into the body region 2 would be severely restricted by the low leakage current through the p-metal Schottky barrier 41.

The field-relief means 41-4-44 may also be used in high Schottky diodes, e.g. for blocking voltages of at least 100 volts or even 200 volts or more. In this case, the barrier height chosen for the Schottky barrier 3 would normally be as high as possible without degrading the speed, e.g. probably at least 0.7 eV for a silicon device. This choice would be made in order to give a low leakage current and hence low reverse dissipation which is required for thermal stability during hot operation, e.g. with barrier temperatures of 100° to 150° C. In such a device the requirement of a high barrier to the n type body portion 2 may cause the height of the barrier 41 which the metal-based layer 11 forms with the p type field-relief regions 4 to be undesirably small for adequately preventing the p type regions 4 from injecting a significant number of minority carriers. If a compromise in barrier height between the active and further barriers 3 and 41 cannot be made, then the height of the barrier 41 may be artifically raised as described below.

Thus for a given composition of the metal-based layer 11 and a given barrier height for the barrier 3 with the n type body portion 2, the height of the barrier 41 formed with the p type field-relief regions 4 can be increased by providing a high n type dopant concentration at the surface of the p type regions 4. In accordance with the teaching in United Kingdom patent (GB-A) No. 1 459 231, this barrier-raising dopant concentration is provided as a layer 51 which is thinner (in the final device structure) than the thickness of the internally generated depletion layer formed at the Schottky barrier 41 between the layer 11 and region 4. The layer 51 will normally be less than 10 nm thick, although the precise extent of the depletion layer formed at the barrier 41 with zero bias depends on the precise value of the dopant concentration in the regions 4.

Figure 2:
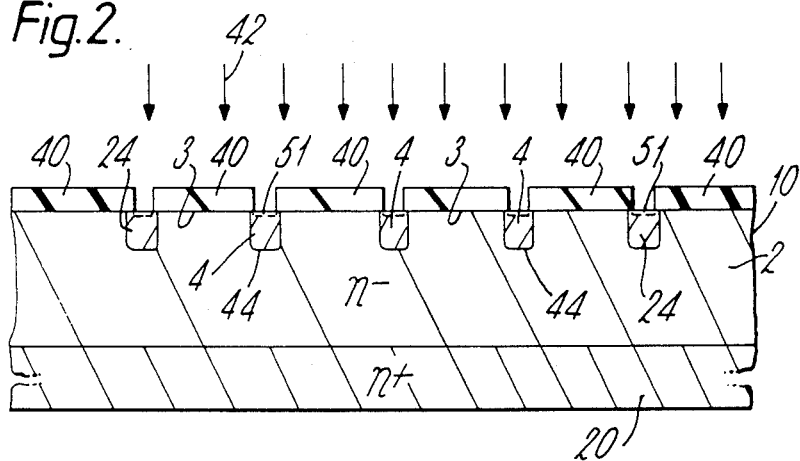
FIG. 2 is a cross-sectional view of part of the semiconductor body of FIG. 1 at a stage in the manufacture of the device.

This layer 51 is indicated by a broken line in FIG. 2 which illustrates how it may be formed by implantation of, for example, arsenic ions via the windows in the masking layer 40 after the heating step to diffuse the regions 4 to the desired depth. In this case, the arrows 42 in FIG. 2 may designate this arsenic ion implantation step to raise the height of the barrier 41. By using the same masking layer 40 for the formation of both the regions 4 and the layer 51, the layer 51 can be confined in a simple manner to the surface of the regions 4 and so does not affect the height of the barrier 3 at the surface of the n type body portion 2 between the regions 4.

Figure 3:
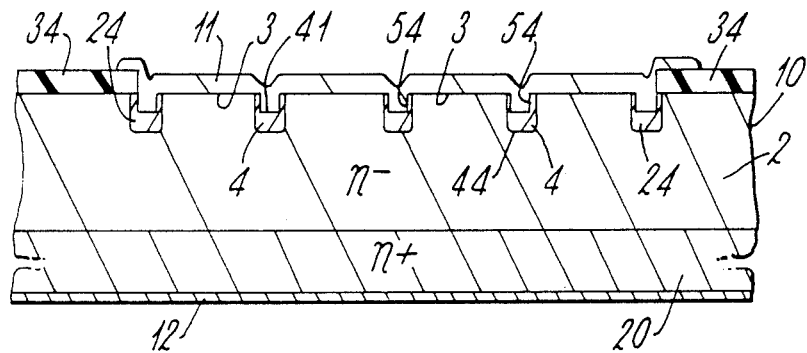
FIGS. 3 and 4 are cross-sectional views of parts of different semiconductor devices also in accordance with the invention.
Figure 4:
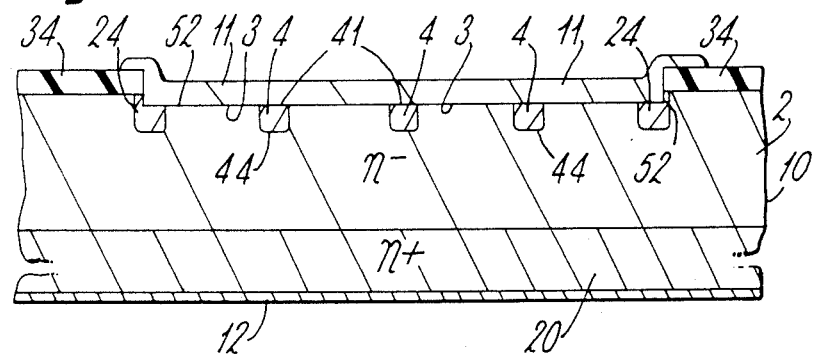

Since with a region formed using dopant diffusion the dopant concentration reduces with diffusion depth in the body, field-relief regions 4 of a desirably low dopant concentration may also be formed by etching away higher doped portions to leave only FIGS. 3 and 4.

In the device of FIG. 3, recesses 54 are present at the body surface where the field-relief regions 4 are contacted by the metal-based layer 11. These recesses 54 remove the more highly-doped part of the regions 4 and may be etched at the windows in the masking layer 40 of FIG. 2 after diffusing the boron implant to a desired depth for the regions 4. Thus, no additional lithographic step is necessary to define these recesses 54.

In the device of FIG. 4 a single recess 52 is present at the whole of the surface area where the metal-based layer 11 forms the active Schottky barrier 3 with the n type body portion 2 and the further Schottky barrier 41 with p type regions 4. Once again, no additional lithographic step is necessary, because the recess 52 can be etched at the mask window used to define the contact window in the insulating layer 34.

It will be evident that many modifications are possible within the scope of the present invention. Thus, for example, the height of the active barrier 3 may be increased or decreased by providing a high doped surface layer within its zero-bias depletion layer in accordance with the teaching in GB-A No. 1459231. Instead of a concentric annular configuration for the field-relief regions 4 and active barrier areas 3, other geometries, for example a mesh or grid arrangement or polygonal array, may be employed.

We claim:

1. A semiconductor device comprising a semiconductor body having a body portion of a first conductivity type, a metal-based layer at a surface of the body and forming an active Schottky barrier with said body portion at a plurality of separate areas, and a plurality of closely-spaced field-relief regions of a second, opposite conductivity type at said surface of the body and extending only partly through said body portion, each of which field-relief regions forms with the body portion a p-n junction which extends to a depth in the body below that of the active Schottky barrier, the separate areas of the active Schottky barrier being located between the closely-spaced field-relief regions, the closely-spaced field-relief regions being distributed throughout the width of said active Schottky barrier and being contacted at said surface by the metal-based layer and being sufficiently closely spaced such that in operation depletion layers extending in the body portion from neighboring field-relief regions merge together under reverse-bias of the active Schottky barrier, and means for establishing a sufficiently low conductivity-type determining dopant concentration of the field-relief regions of less than about $5 \times 10^{16}$ cm$^{-3}$ at the surface where contacted by the metal-based layer to form with the metal-based layer a further Schottky barrier which is in series with the p-n junction between the field-relief regions and the body portion, thus restricting the flow of minority carriers into the body portion under forward-bias of the active Schottky barrier.

2. A device as claimed in claim 1, further characterized in that, where the field-relief regions are contacted by the metal-based layer, recesses are provided at the surface of the body which extend in said body to a depth less than that of said field relief regions.

3. A device as claimed in claim 1, further characterized in that a single recess is present at the whole of the surface area where the metal-based layer forms said active Schottky barrier and said further Schottky barrier.

4. A device as claimed in claim 1, 2 or 3 further characterized in that the height of said further Schottky barrier formed with said field-relief regions is at least half that of said active Schottky barrier formed with said body portion.

5. A device as claimed in claim 1, 2 or 3, further characterized in that, at the surface of the field-relief regions, a dopant concentration of said first conductivity type and of a level higher than that of said second conductivity is present as a layer which is thinner than the thickness of the internally-generated depletion layer formed at said further Schottky barrier with zero bias and which is depleted thereby, the presence of said dopant layer serving to increase the height of said further Schottky barrier.

6. A device as claimed in claim 1, 2 or 3, wherein said body is of silicon, and said field-relief regions are of p-type conductivity material formed by a boron concentration which is less than $5 \times 10^{16}$ cm$^{-3}$ at the surface where contacted by the metal-based layer.

* * * * *